(12) United States Patent
Fan

(10) Patent No.: US 12,243,769 B2
(45) Date of Patent: Mar. 4, 2025

(54) METHOD FOR PREPARING SEMICONDUCTOR DEVICE STRUCTURE USING NITROGEN-CONTAINING PATTERN

(71) Applicant: NANYA TECHNOLOGY CORPORATION, New Taipei (TW)

(72) Inventor: Cheng-Hsiang Fan, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 392 days.

(21) Appl. No.: 17/735,284

(22) Filed: May 3, 2022

(65) Prior Publication Data

US 2023/0360957 A1 Nov. 9, 2023

(51) Int. Cl.
*H01L 21/762* (2006.01)
*H01L 21/308* (2006.01)
*H01L 21/3105* (2006.01)

(52) U.S. Cl.
CPC ...... *H01L 21/76224* (2013.01); *H01L 21/308* (2013.01); *H01L 21/31053* (2013.01)

(58) Field of Classification Search
CPC ......... H01L 21/76224; H01L 21/31053; H01L 21/3086; H01L 21/76232; H01L 21/02247; H01L 21/02249; H01L 21/02614; H01L 21/308–3083; H01L 21/027–0338

See application file for complete search history.

(56) References Cited

U.S. PATENT DOCUMENTS

2005/0142797 A1* 6/2005 Ahn ................. H01L 21/76224
257/E21.546
2014/0353752 A1 12/2014 Cheng et al.

FOREIGN PATENT DOCUMENTS

| CN | 104091779 A | | 10/2014 | |
| CN | 107195536 A | * | 9/2017 | ....... H01L 21/02458 |
| TW | 201517123 A | | 5/2015 | |
| TW | 201725279 A | | 7/2017 | |
| TW | 202025302 A | | 7/2020 | |

OTHER PUBLICATIONS

Office Action and and the search report mailed on Oct. 3, 2023 related to Taiwanese Application No. 111122900.

* cited by examiner

*Primary Examiner* — Shahed Ahmed
(74) *Attorney, Agent, or Firm* — Xuan Zhang

(57) ABSTRACT

A method for preparing a semiconductor device structure includes forming a nitrogen-containing pattern over a semiconductor substrate. The method also includes performing an energy treating process to form a transformed portion in the semiconductor substrate and covered by the nitrogen-containing pattern. The method further includes etching the semiconductor substrate such that the transformed portion is surrounded by an opening structure.

18 Claims, 20 Drawing Sheets

METHOD FOR PREPARING SEMICONDUCTOR DEVICE STRUCTURE USING NITROGEN-CONTAINING PATTERN

TECHNICAL FIELD

The present disclosure relates to a method for preparing a semiconductor device structure, and more particularly, to a method for preparing a semiconductor device structure using a nitrogen-containing pattern.

DISCUSSION OF THE BACKGROUND

Semiconductor devices are essential for many modern applications. With the advancement of electronic technology, semiconductor devices are becoming smaller in size while providing greater functionality and including greater amounts of integrated circuitry. Due to the miniaturized scale of semiconductor devices, various types and dimensions of semiconductor devices providing different functionalities are integrated and packaged into a single module. Furthermore, numerous manufacturing operations are implemented for integration of various types of semiconductor devices.

However, the manufacturing and integration of semiconductor devices involve many complicated steps and operations. Integration in semiconductor devices becomes increasingly complicated. An increase in complexity of manufacturing and integration of the semiconductor device may cause deficiencies. Accordingly, there is a continuous need to improve the manufacturing process of semiconductor devices so that the problems can be addressed.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

In one embodiment of the present disclosure, a method for preparing a semiconductor device structure is provided. The method includes forming a nitrogen-containing pattern over a semiconductor substrate. The method also includes performing an energy treating process to form a transformed portion in the semiconductor substrate and covered by the nitrogen-containing pattern. The method further includes etching the semiconductor substrate such that the transformed portion is surrounded by an opening structure.

In an embodiment, the method further includes removing the nitrogen-containing pattern after the energy treating process is performed. In an embodiment, the nitrogen-containing pattern is removed before the semiconductor substrate is etched. In an embodiment, the semiconductor substrate is etched using transformed portion as an etching mask. In an embodiment, the method further includes forming an isolation structure in the opening structure, wherein an active area in the semiconductor substrate is surrounded by the isolation structure.

In an embodiment, the forming the isolation structure includes forming a dielectric material covering the transformed portion and the semiconductor substrate, wherein the opening structure is filled by the dielectric material. In an embodiment, the forming the isolation structure further includes performing a planarization process on the dielectric material to remove the transformed portion and a portion of the dielectric material.

In another embodiment of the present disclosure, a method for preparing a semiconductor device structure is provided. The method includes forming a nitrogen-containing pattern over a semiconductor substrate. The method also includes performing an energy treating process to transform a portion of the semiconductor substrate into a transformed portion. The method further includes removing the nitrogen-containing pattern to expose the transformed portion. In addition, the method includes performing an etching process on the semiconductor substrate using the transformed portion as an etching mask.

In an embodiment, the transformed portion is covered by and in direct contact with the nitrogen-containing pattern before the nitrogen-containing pattern is removed. In an embodiment, the etching process is performed after the nitrogen-containing pattern is removed. In an embodiment, a portion of the semiconductor substrate exposed by the transformed portion is removed to form an opening structure during the etching process, and an interface between the transformed portion and the semiconductor substrate is higher than a bottom surface of the opening structure.

In an embodiment, the opening structure has a ring shape, and the transformed portion has an island shape surrounded by the opening structure. In an embodiment, the method further includes filling the opening structure with an isolation structure, and removing the transformed portion such that an active area surrounded by the isolation structure is exposed.

In yet another embodiment of the present disclosure, a method for preparing a semiconductor device is provided. The method includes forming a plurality of nitrogen-containing patterns over a semiconductor substrate. The method also includes performing an energy treating process to transform portions of the semiconductor substrate into a plurality of transformed portions. The method further includes removing the nitrogen-containing patterns after the energy treating process is performed. In addition, the method includes performing an etching process on the semiconductor substrate using the transformed portions as an etching mask, such that each of the transformed portions is surrounded by an opening structure.

In an embodiment, the forming the nitrogen-containing patterns includes forming a nitrogen-containing layer over the semiconductor substrate, forming a patterned mask over the nitrogen-containing layer, and etching the nitrogen-containing layer using the patterned mask as an etching mask. In an embodiment, the nitrogen-containing patterns are parallel to and separated from each other. In an embodiment, the method further includes forming an isolation structure in the opening structure, and removing the transformed portions to expose a plurality of active areas in the semiconductor substrate.

In an embodiment, each of the active areas has an island shape surrounded by the isolation structure. In an embodiment, the energy treating process includes a nitridation process. In an embodiment, a top surface of the transformed portions is higher than a top surface of the semiconductor substrate before the etching process is performed.

Embodiments of a method for preparing a semiconductor device structure are provided in the disclosure. The method includes performing an energy-treating process on a semiconductor substrate to form a transformed portion covered by a nitrogen-containing pattern. The method also includes etching the semiconductor substrate to form an opening structure using the transformed portion as an etching mask. In some embodiments, an isolation structure is formed in the opening structure. Therefore, a lower contact resistance between an active area surrounded by the isolation structure and an overlying contact can be obtained without increasing the size of the active area. As a result, the fabrication cost and time of the semiconductor device structure can be reduced, and greater design flexibility can be achieved.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
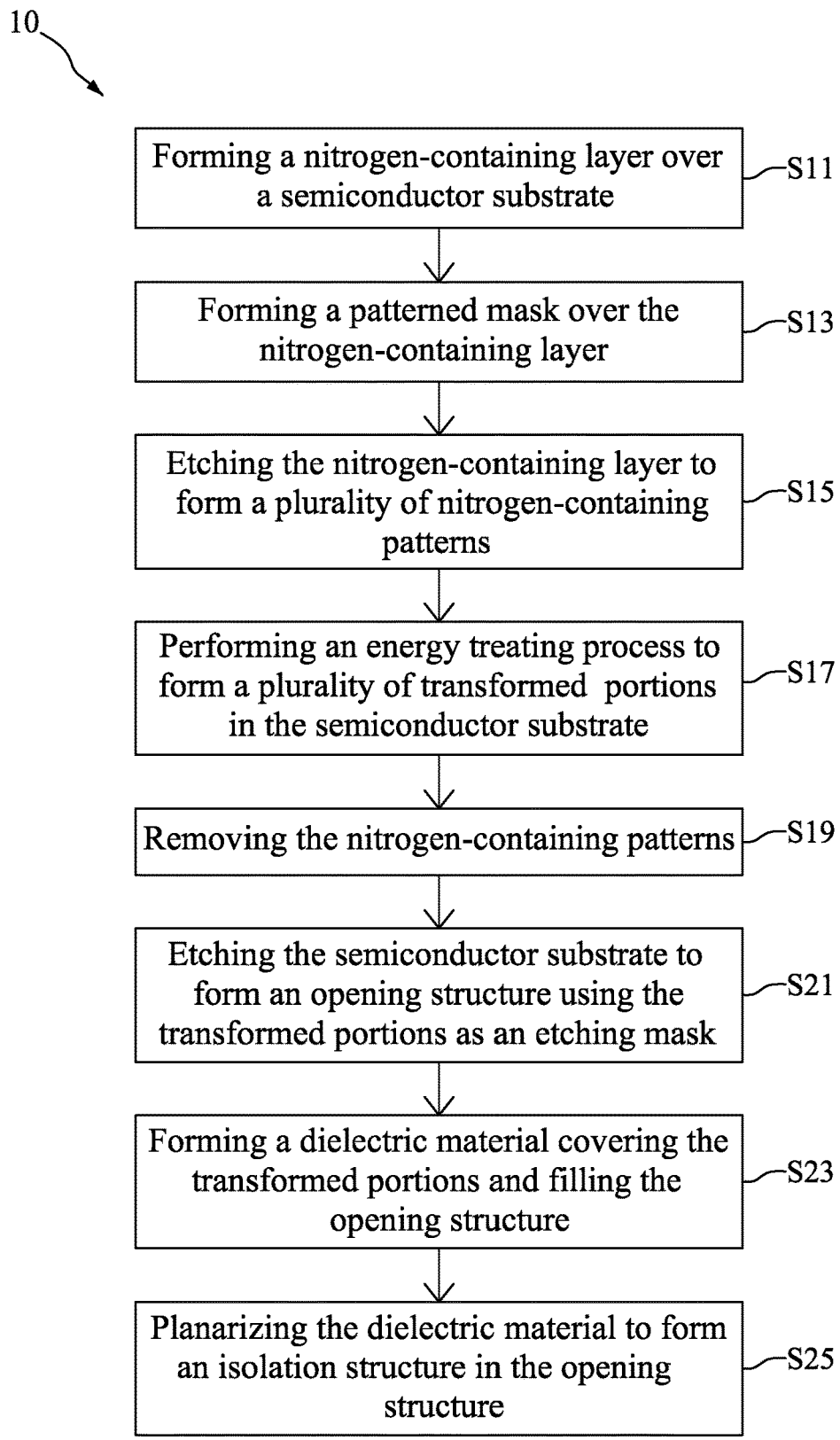
FIG. 1 is a flow diagram illustrating a method for preparing a semiconductor device structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow diagram illustrating a method 10 for preparing a semiconductor device structure 100, and the method 10 includes steps S11, S13, S15, S17, S19, S21, S23 and S25, in accordance with some embodiments. The steps S11-S25 of FIG. 1 are first introduced briefly and then elaborated in connection with FIGS. 2-17. As shown in FIG. 1, the method 10 begins at step S11 where a nitrogen-containing layer is formed over a semiconductor substrate.

Next, at step S13, a patterned mask is formed over the nitrogen-containing layer, and at step S15, the nitrogen-containing layer is etched to form a plurality of nitrogen-containing patterns. In some embodiments, each of the nitrogen-containing patterns are arranged parallel to each other. At step S17, an energy treating process is performed to form a plurality of transformed portions in the semiconductor substrate.

In some embodiments, the transformed portions are covered by the nitrogen-containing patterns. In some embodiments, portions of the semiconductor substrate covered by the nitrogen-containing patterns are transformed into the transformed portions. In some embodiments, the transformed portions are aligned with the nitrogen-containing patterns.

Subsequently, at step S19, the nitrogen-containing patterns are removed, and at step S21, an etching process is performed on the semiconductor substrate to form an opening structure using the transformed portions as an etching mask. In some embodiments, each of the transformed portions are surrounded by the opening structure. In some embodiments, the opening structure has a ring shape, and each of the transformed portions has an island shape surrounded by the opening structure.

At step S23, a dielectric material is formed covering the transformed portions and filling the opening structure. Then, at step S25, a planarization process is performed on the dielectric material to form an isolation structure in the opening structure. In some embodiments, the portions of the semiconductor substrate covered by the transformed portions are exposed after the planarization process and become active areas (AA). In some embodiments, each of the active areas has an island shape surrounded by the isolation structure.

Figure 2:
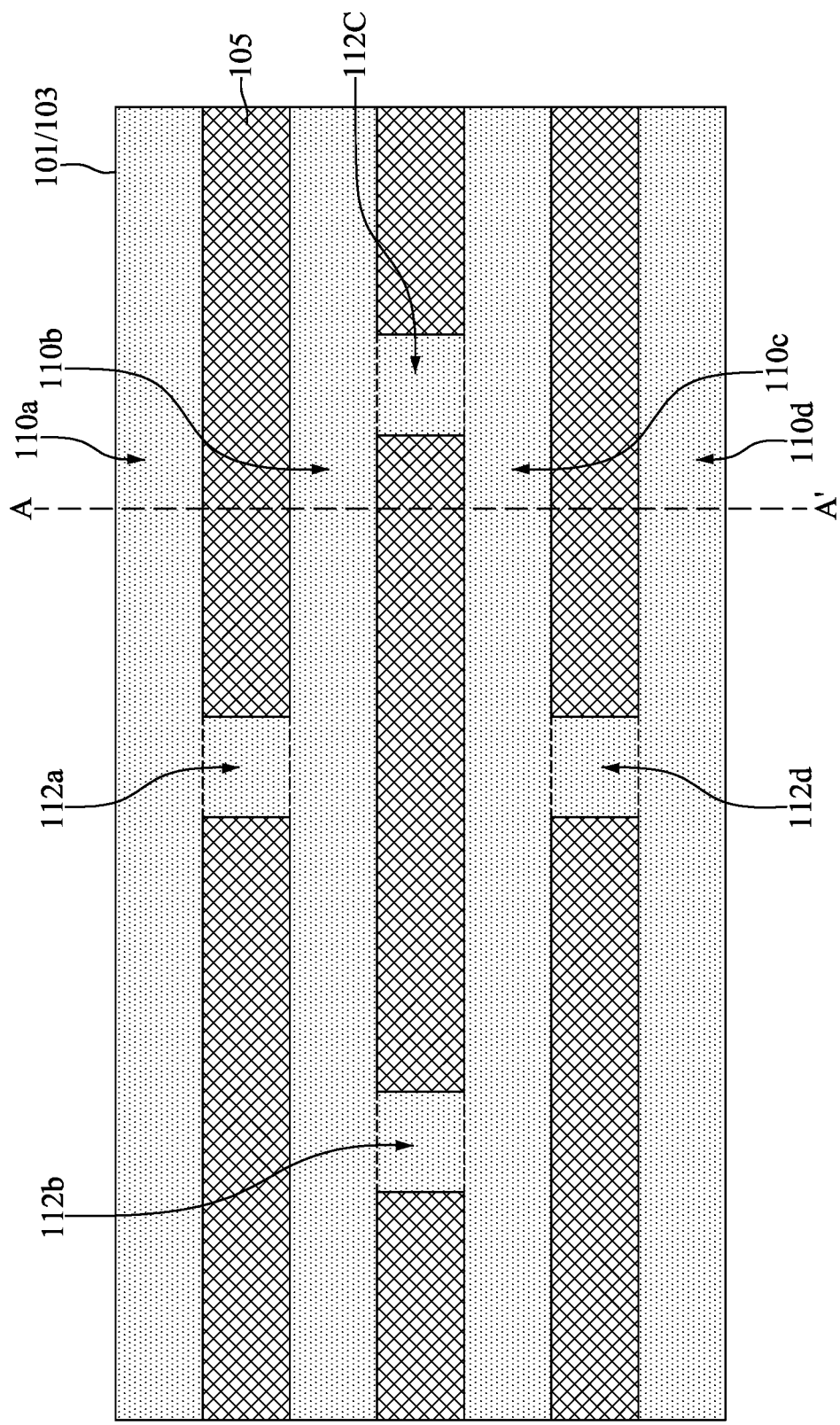
FIG. 2 is a top view illustrating an intermediate stage of sequentially forming a nitrogen-containing layer and a patterned mask over a semiconductor substrate during the formation of the semiconductor device structure, in accordance with some embodiments.
Figure 3:
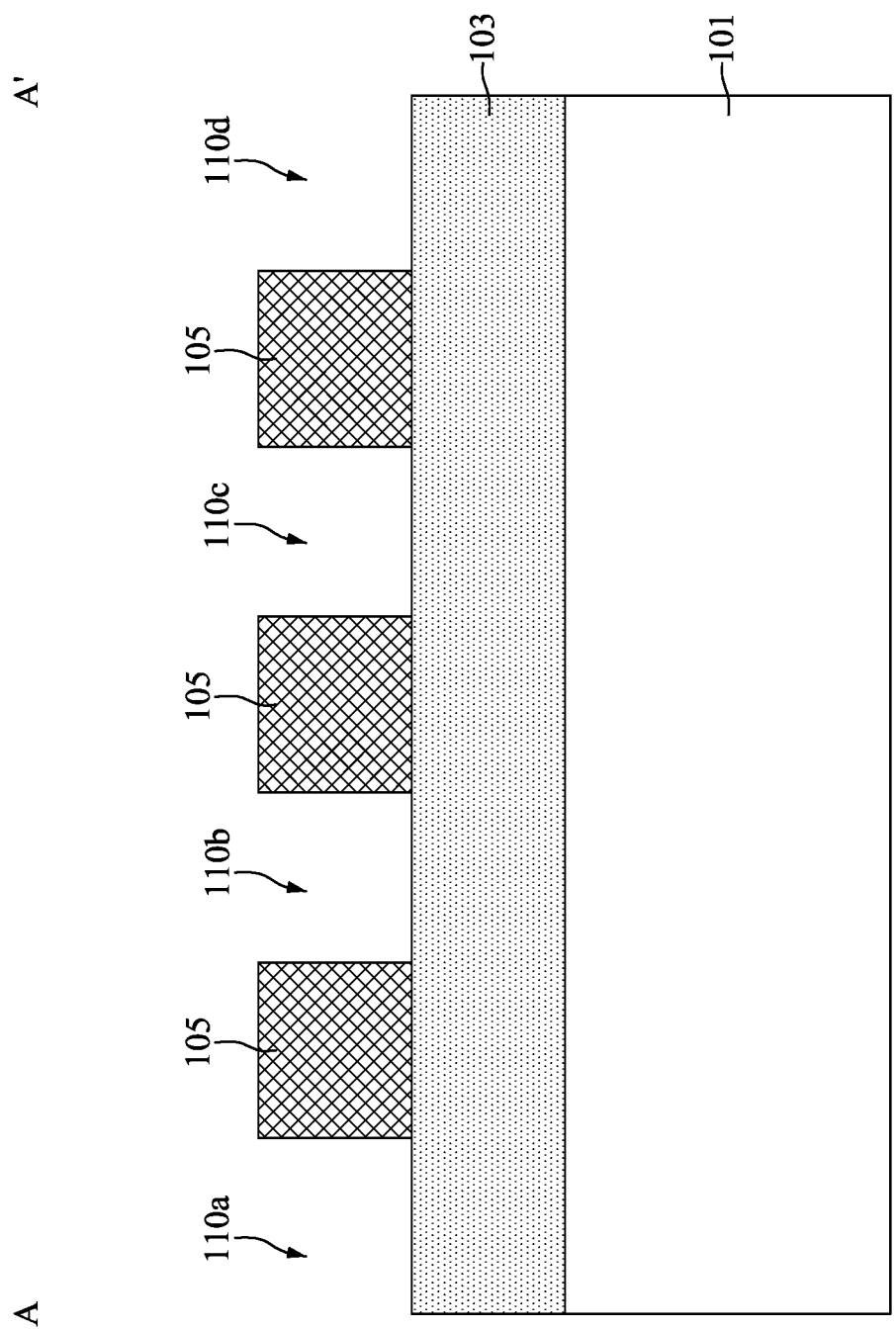
FIG. 3 is a cross-sectional view taken along line A-A' in FIG. 2, in accordance with some embodiments.

FIGS. 2-17 are top views and cross-sectional views illustrating various stages of forming the semiconductor device structure 100 (FIGS. 16 and 17) by the method 10 of FIG. 1, in accordance with some embodiments. As shown in FIGS. 2 and 3, a nitrogen-containing layer 103 is formed over a semiconductor substrate 101, and a patterned mask 105 is formed over the nitrogen-containing layer 103, in accordance with some embodiments. The respective steps are illustrated as the steps S11-S13 in the method 10 shown in FIG. 1.

The semiconductor substrate 101 may be a semiconductor wafer such as a silicon wafer. Alternatively or additionally, the semiconductor substrate 101 may include elementary semiconductor materials, compound semiconductor materials, and/or alloy semiconductor materials. Examples of the elementary semiconductor materials may include, but are not limited to, crystal silicon, polycrystalline silicon, amorphous silicon, germanium, and/or diamond. Examples of the compound semiconductor materials may include, but are not limited to, silicon carbide, gallium arsenic, gallium phosphide, indium phosphide, indium arsenide, and/or indium antimonide. Examples of the alloy semiconductor materials may include, but are not limited to, SiGe, GaAsP, AlInAs, AlGaAs, GaInAs, GaInP, and/or GaInAsP.

In some embodiments, the semiconductor substrate 101 includes an epitaxial layer. For example, the semiconductor substrate 101 has an epitaxial layer overlying a bulk semiconductor. In some embodiments, the semiconductor substrate 101 is a semiconductor-on-insulator substrate which may include a substrate, a buried oxide layer over the substrate, and a semiconductor layer over the buried oxide layer, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

In some embodiments, the nitrogen-containing layer 103 is made of a nitrogen-containing material, such as silicon nitride or silicon oxynitride. In some embodiments, the nitrogen-containing layer 103 is formed by a deposition process, such as a chemical vapor deposition (CVD) process, a physical vapor deposition (PVD) process, an atomic layer deposition (ALD) process, a spin-on coating process, or another suitable method.

In some embodiments, a patterned mask 105 with a plurality of openings 110a, 110b, 110c, 110d, 112a, 112b, 112c and 112d is formed over the nitrogen-containing layer 103. In some embodiments, the openings 110a, 110b, 110c and 110d are parallel to each other and are physically connected through the openings 112a, 112b, 112c and 112d. In addition, the nitrogen-containing layer 103 is exposed by the openings 110a, 110b, 110c, 110d, 112a, 112b, 112c and 112d. In some embodiments, the nitrogen-containing layer 103 and the patterned mask 105 include different materials so that the etching selectivities may be different in the subsequent etching process.

Figure 4:
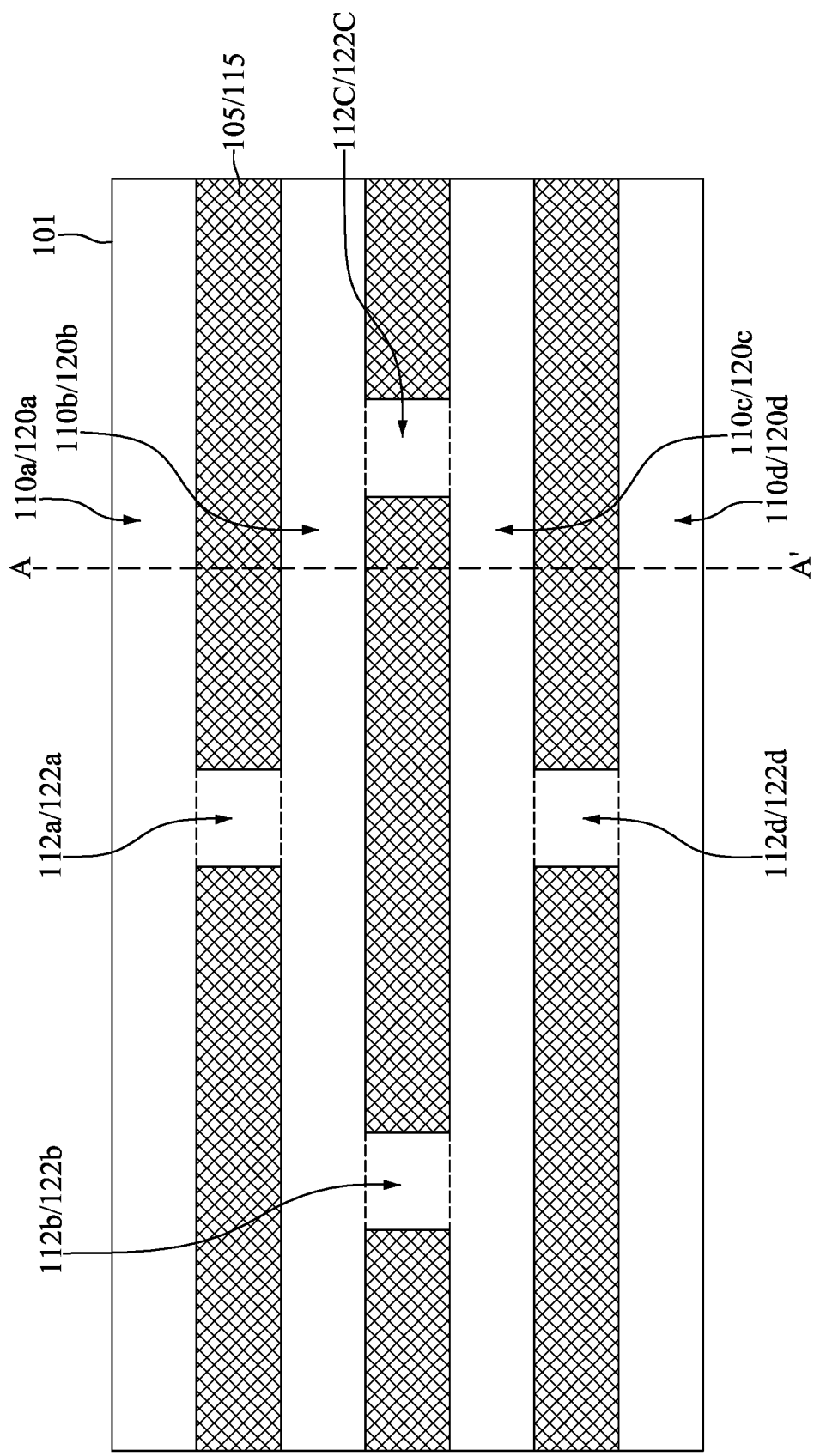
FIG. 4 is a top view illustrating an intermediate stage of etching the nitrogen-containing layer to form a plurality of nitrogen-containing patterns during the formation of the semiconductor device structure, in accordance with some embodiments.
Figure 5:
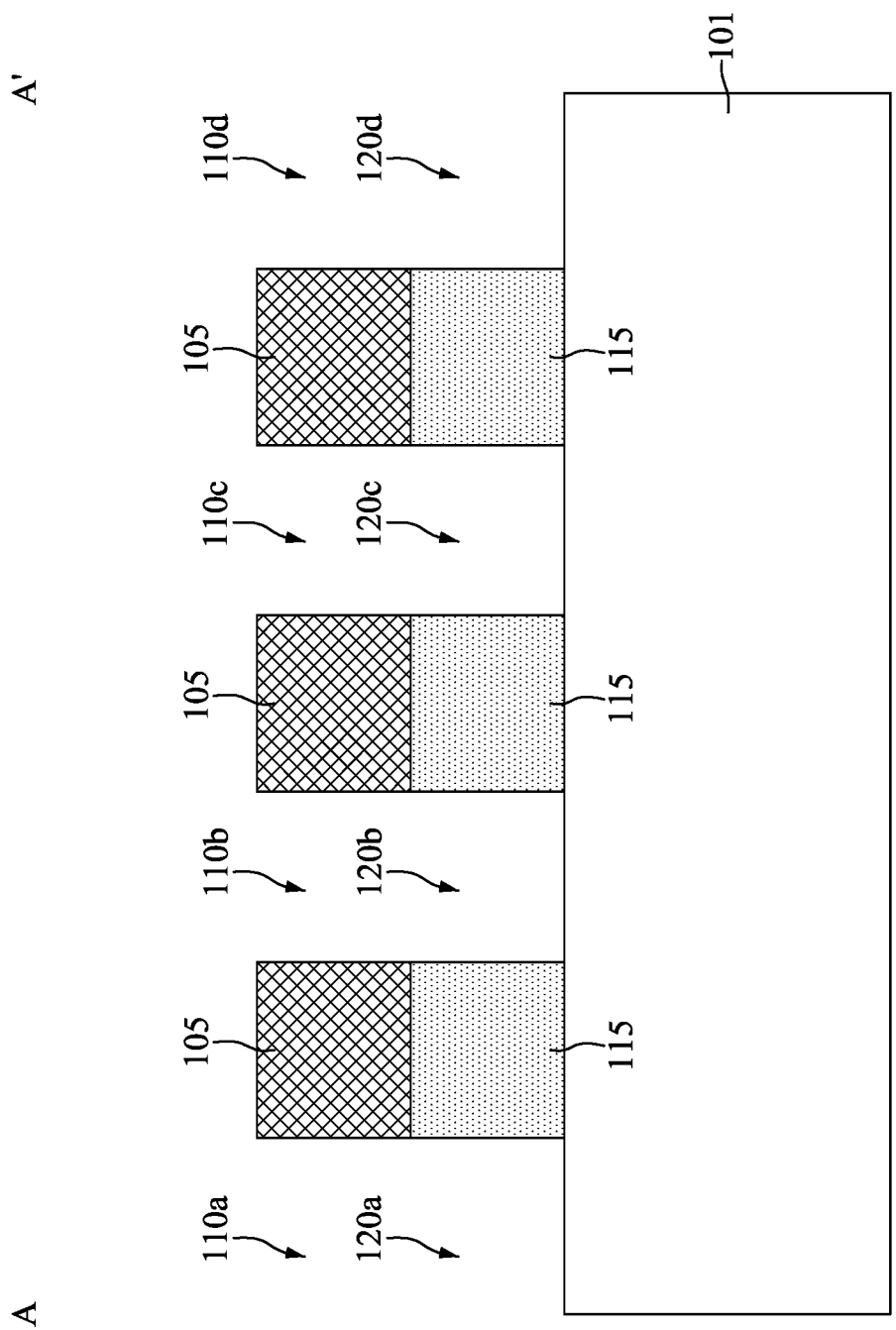
FIG. 5 is a cross-sectional view taken along line A-A' in FIG. 4, in accordance with some embodiments.

Next, an etching process is performed on the nitrogen-containing layer 103 using the patterned mask 105 as an etching mask, such that a plurality of nitrogen-containing patterns 115 are formed, as shown in FIGS. 4 and 5 in accordance with some embodiments. The respective step is illustrated as the step S15 in the method 10 shown in FIG. 1. In some embodiments, a plurality of openings 120a, 120b, 120c, 120d, 122a, 122b, 122c and 122d are formed penetrating through the nitrogen-containing layer 103, such that the semiconductor substrate 101 is exposed by the openings 120a, 120b, 120c, 120d, 122a, 122b, 122c and 122d. The etching process may be a wet etching process, a dry etching process, or a combination thereof.

Figure 6:
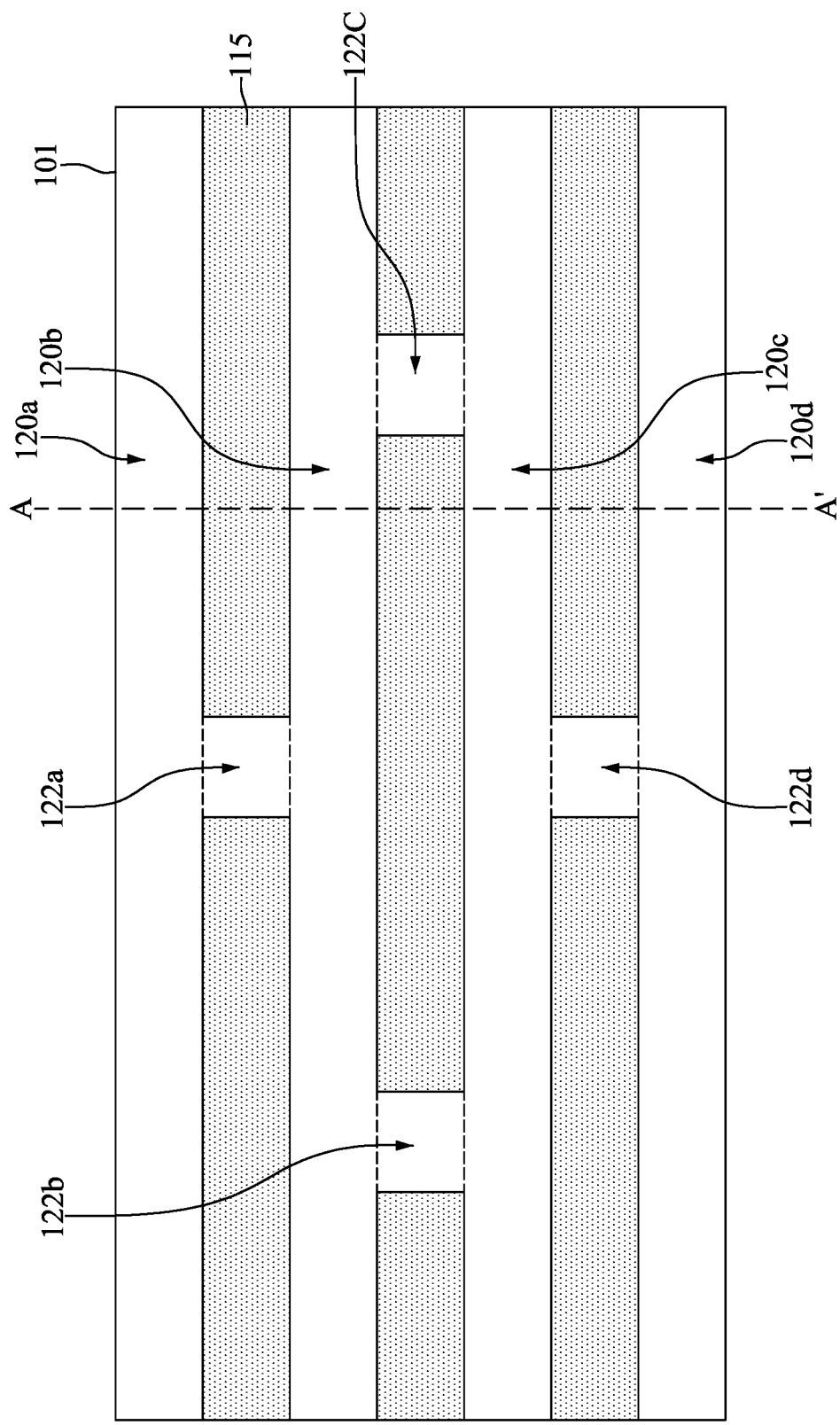
FIG. 6 is a top view illustrating an intermediate stage of removing the patterned mask during the formation of the semiconductor device structure, in accordance with some embodiments.
Figure 7:
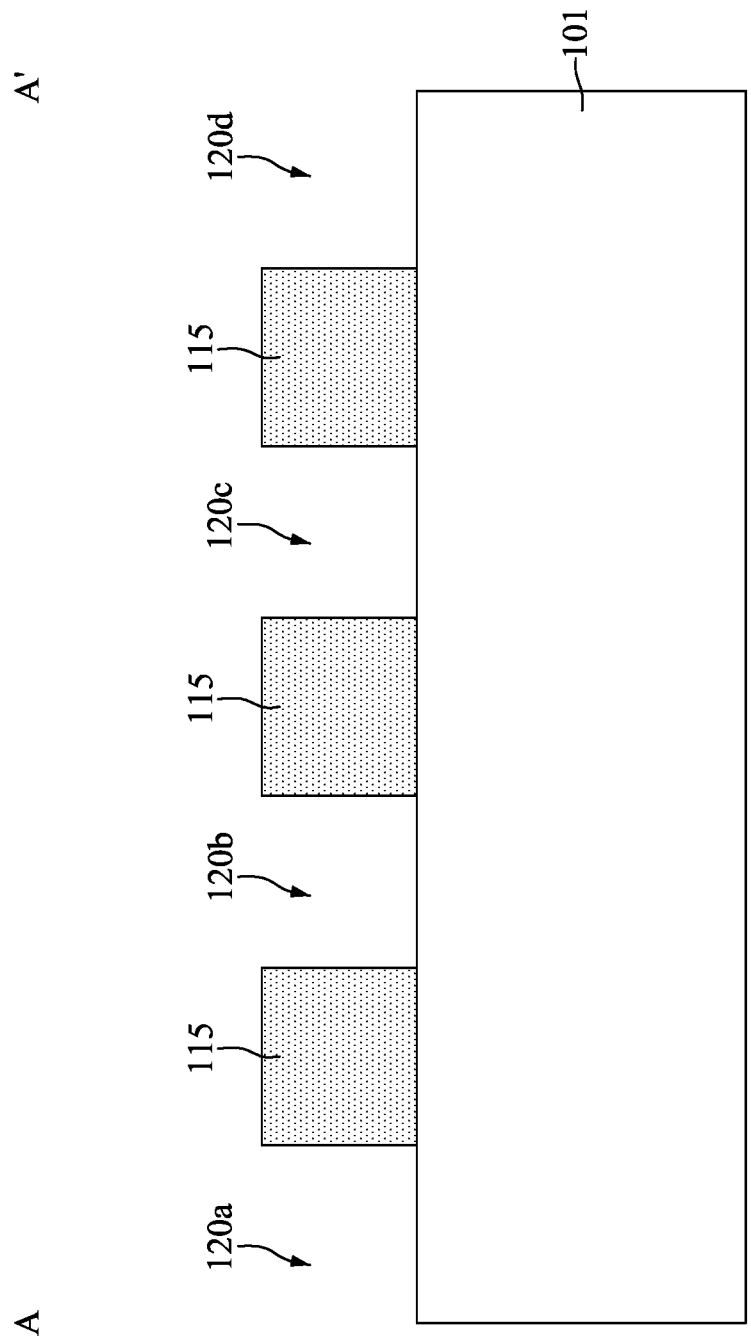
FIG. 7 is a cross-sectional view taken along line A-A' in FIG. 6, in accordance with some embodiments.

After the nitrogen-containing patterns 115 are formed over the semiconductor substrate 101, the patterned mask 105 is removed, as shown in FIGS. 6 and 7 in accordance with some embodiments. In some embodiments, the patterned mask 105 is removed by a stripping process, an ashing process, an etching process, or another suitable process.

Figure 8:
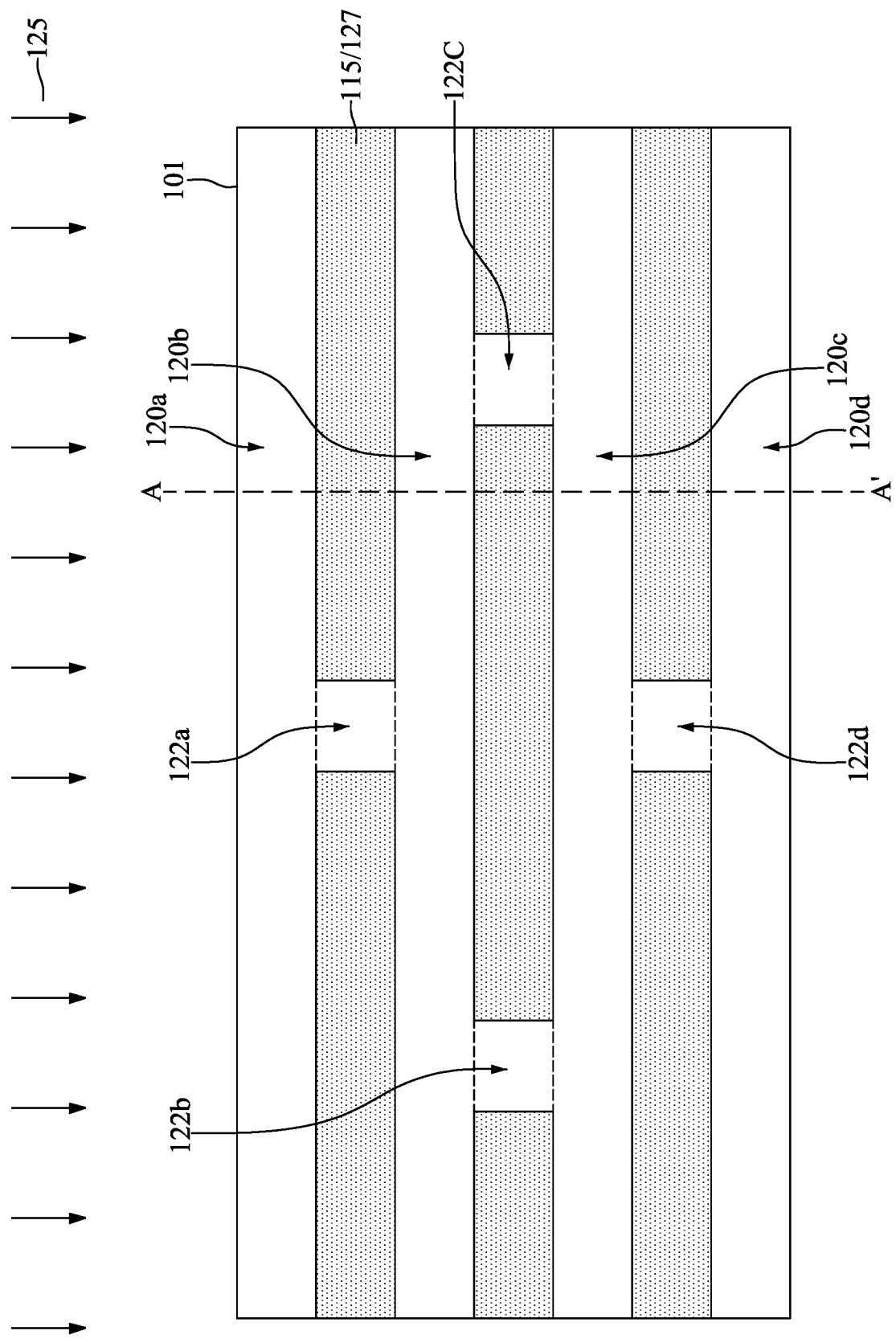
FIG. 8 is a top view illustrating an intermediate stage of performing an energy treating process to form a plurality of transformed portions in the semiconductor substrate during the formation of the semiconductor device structure, in accordance with some embodiments.
Figure 9:
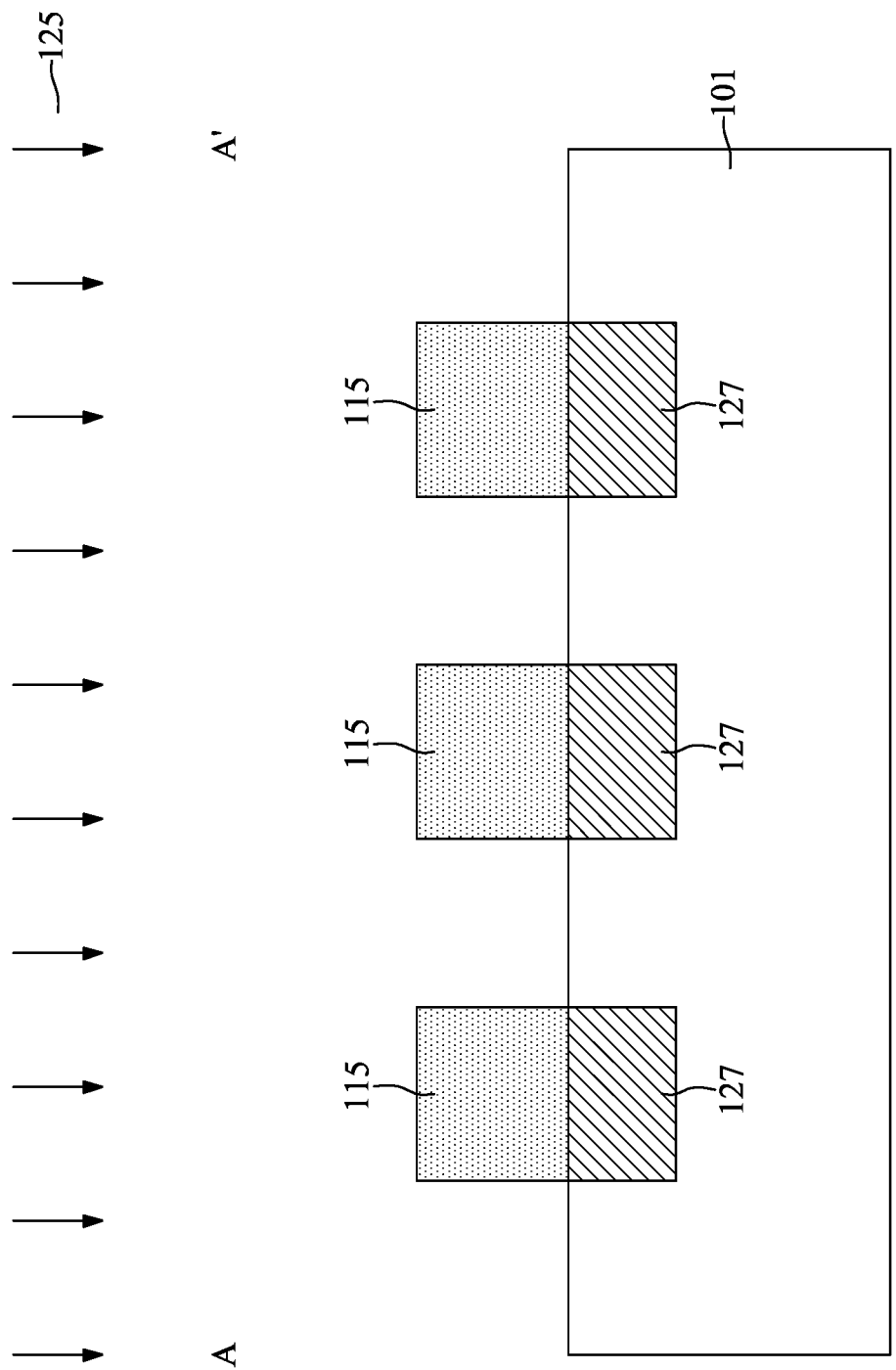
FIG. 9 is a cross-sectional view taken along line A-A' in FIG. 8, in accordance with some embodiments.

Subsequently, an energy treating process 125 is performed to form a plurality of transformed portions 127 in the semiconductor substrate 101, as shown in FIGS. 8 and 9 in accordance with some embodiments. The respective step is illustrated as the step S17 in the method 10 shown in FIG. 1. In some embodiments, the portions of the semiconductor substrate 101 covered by and in direct contact with the nitrogen-containing patterns 115 are transformed into the transformed portions 127, while the portions of the semiconductor substrate 101 exposed by the nitrogen-containing patterns 115 remain intact during the energy treating process 125.

In some embodiments, the energy treating process 125 includes a nitridation process. In some embodiments, each of the transformed portions 127 has an island shape. In addition, the transformed portions 127 are parallel to each other, in accordance with some embodiments.

Figure 10:
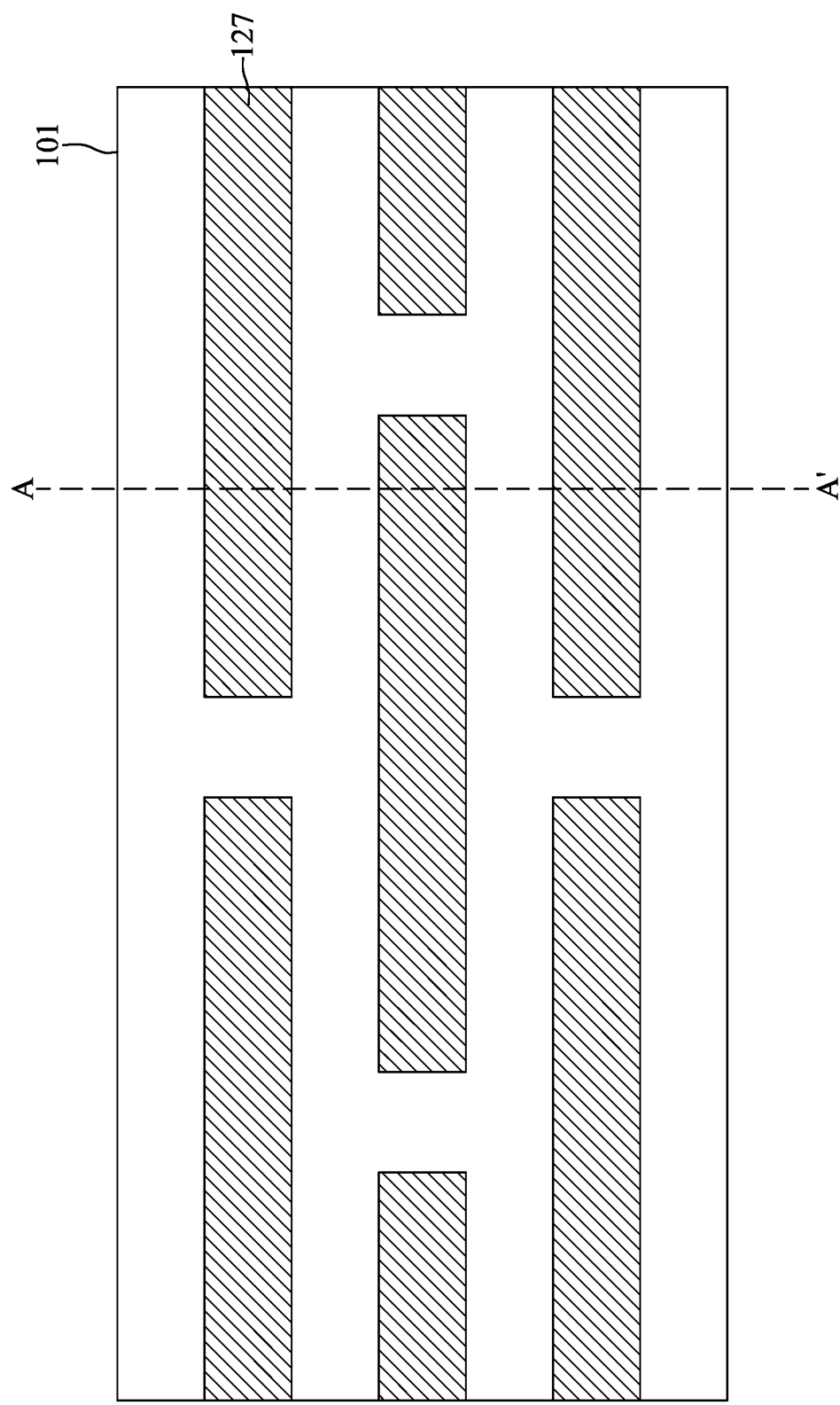
FIG. 10 is a top view illustrating an intermediate stage of removing the nitrogen-containing patterns during the formation of the semiconductor device structure, in accordance with some embodiments.
Figure 11:
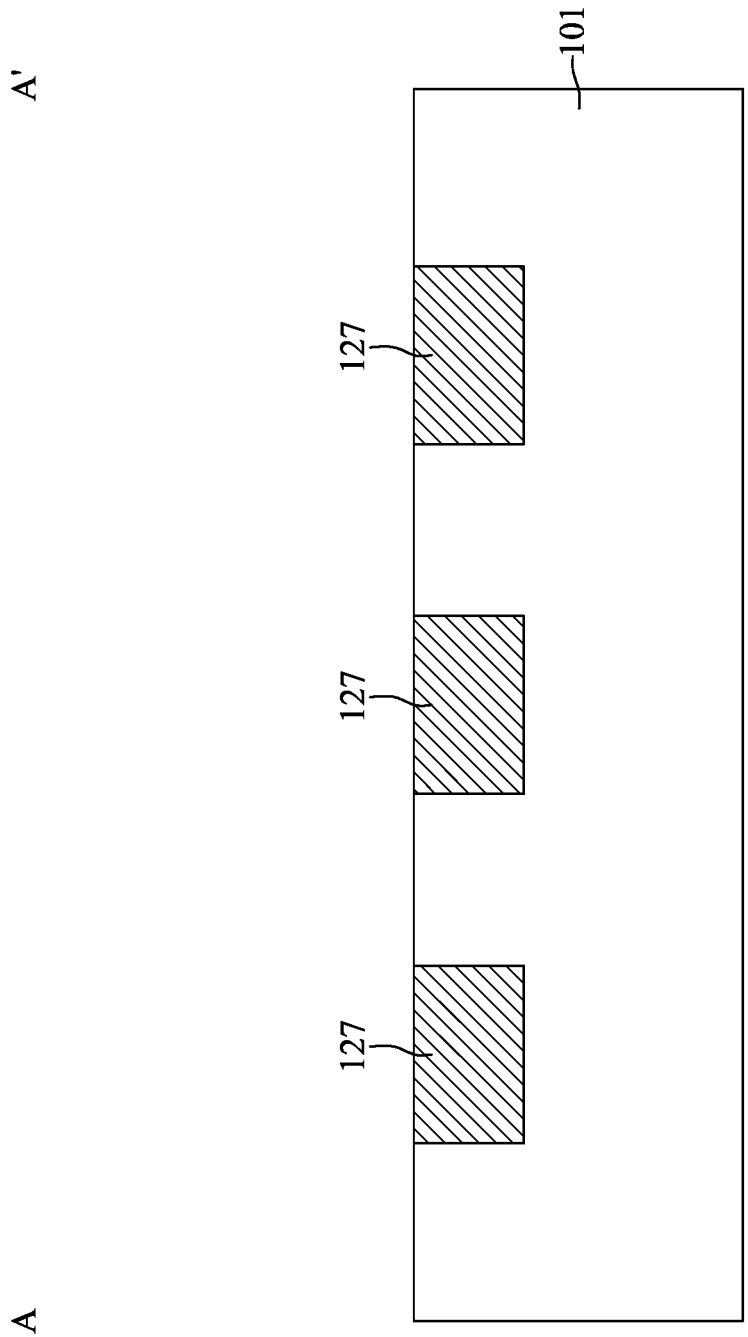
FIG. 11 is a cross-sectional view taken along line A-A' in FIG. 10, in accordance with some embodiments.

After the energy treating process 125 is performed, the nitrogen-containing patterns 115 are removed, as shown in FIGS. 10 and 11 in accordance with some embodiments. The respective step is illustrated as the step S19 in the method 10 shown in FIG. 1. In some embodiments, the nitrogen-containing patterns 115 are removed to expose the transformed portions 127. In some embodiments, the nitrogen-containing patterns 115 are removed by a stripping process, an ashing process, an etching process, or another suitable process.

Figure 12:
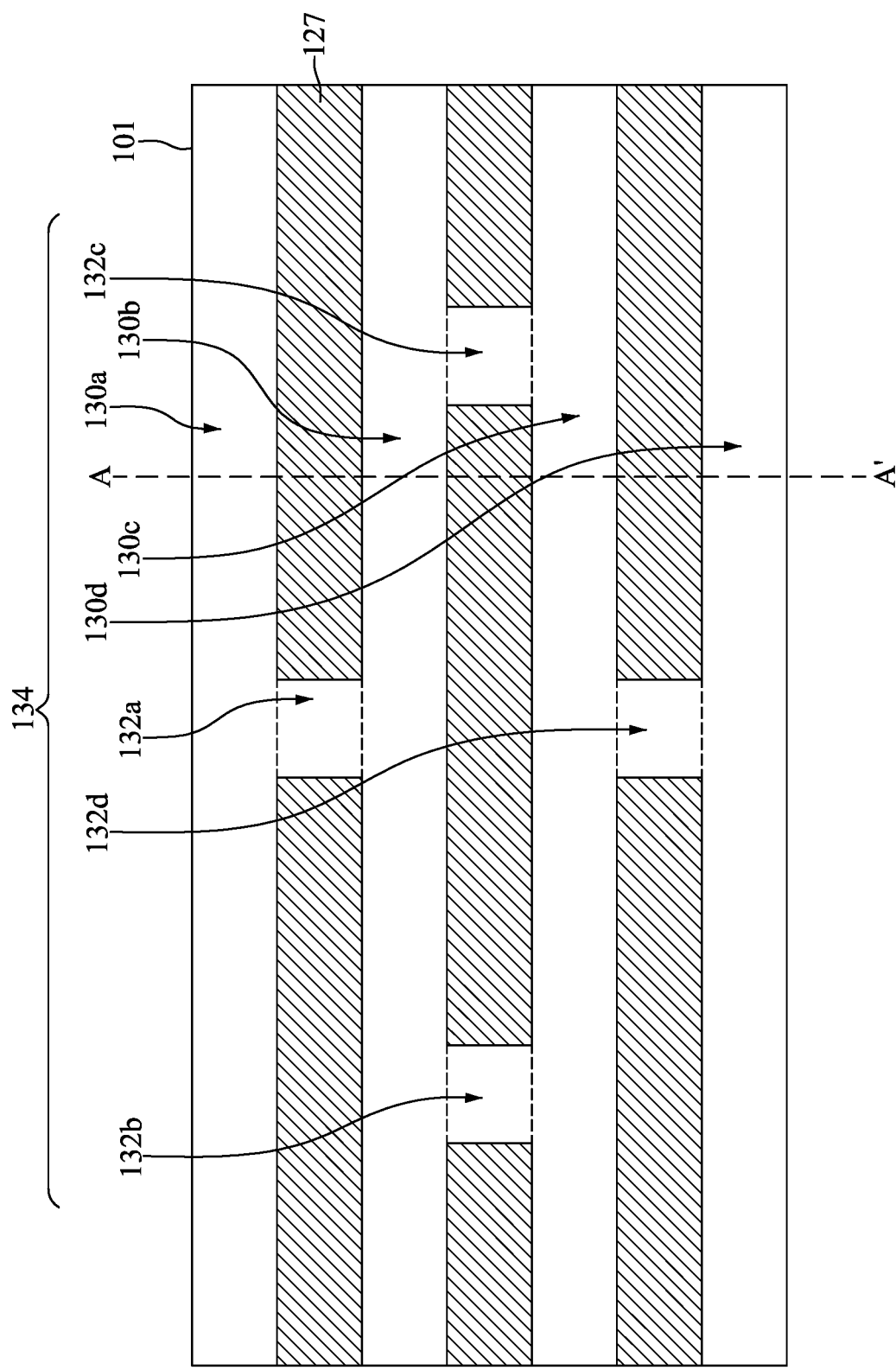
FIG. 12 is a top view illustrating an intermediate stage of etching the semiconductor substrate to form an opening structure using the transformed portions as an etching mask during the formation of the semiconductor device structure, in accordance with some embodiments.
Figure 13:
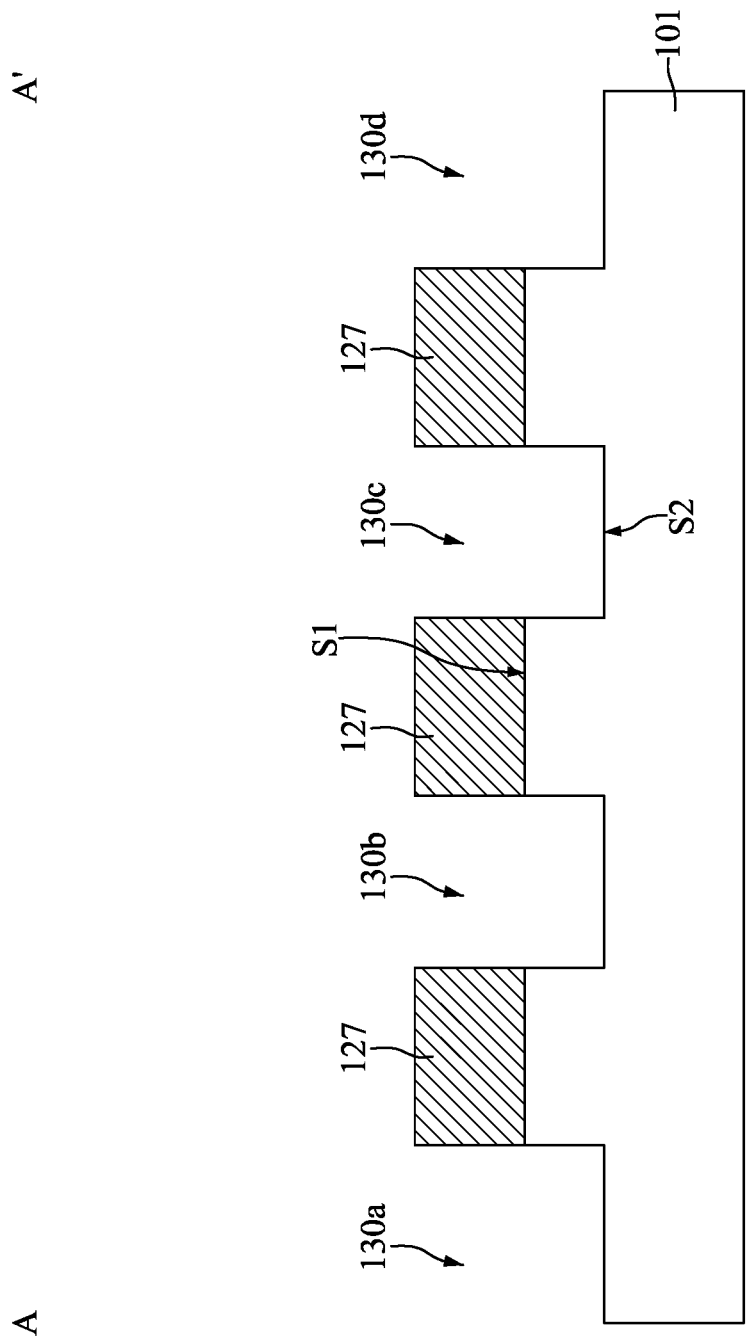
FIG. 13 is a cross-sectional view taken along line A-A' in FIG. 12, in accordance with some embodiments.

Then, an etching process is performed on the semiconductor substrate 101 to form an opening structure 134 using the transformed portions 127 as an etching mask, as shown in FIGS. 12 and 13 in accordance with some embodiments. The respective step is illustrated as the step S21 in the method 10 shown in FIG. 1. The etching process may be a wet etching process, a dry etching process, or a combination thereof.

In some embodiments, the portions of the semiconductor substrate 101 exposed by the transformed portions 127 are partially removed to form the opening structure 134. In some embodiments, the opening structure 134 includes a plurality of openings 130*a*, 130*b*, 130*c*, 130*d*, 132*a*, 132*b*, 132*c* and 132*d*. In some embodiments, the openings 130*a*, 130*b*, 130*c* and 130*d* are parallel to each other and are physically connected through the openings 132*a*, 132*b*, 132*c* and 132*d*. Moreover, the interfaces S1 between the transformed portions 127 and the semiconductor substrate 101 are higher than the bottom surfaces S2 of the opening structure 134, in accordance with some embodiments.

Figure 14:
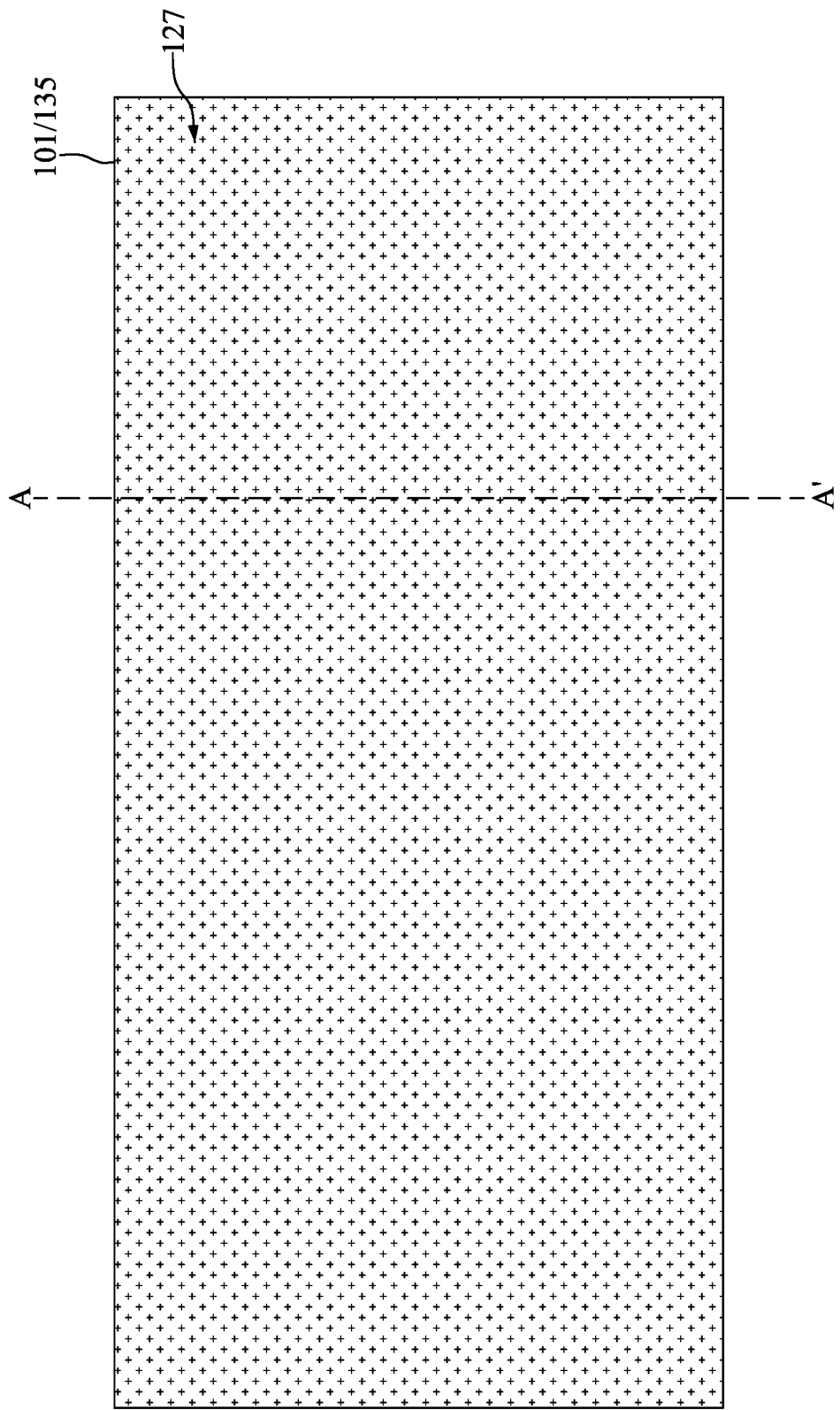
FIG. 14 is a top view illustrating an intermediate stage of forming a dielectric material covering the transformed portions and filling the opening structure during the formation of the semiconductor device structure, in accordance with some embodiments.
Figure 15:
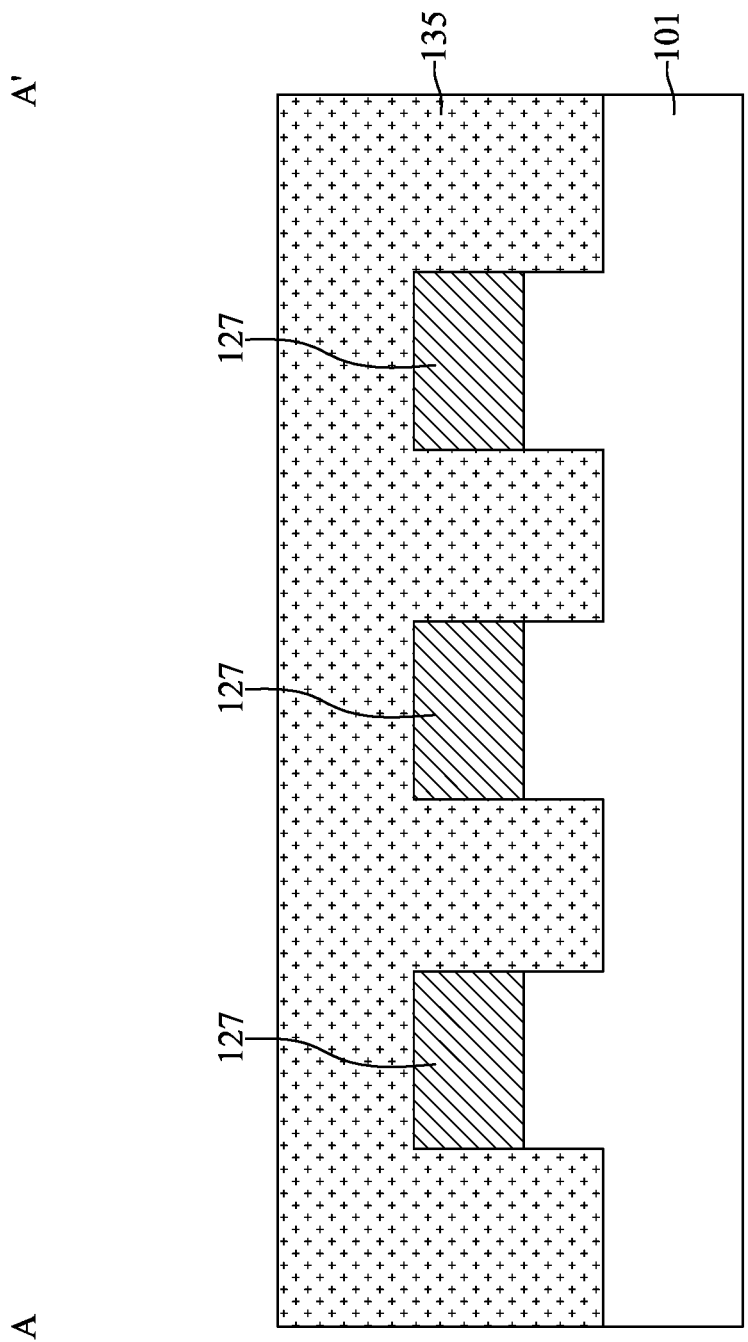
FIG. 15 is a cross-sectional view taken along line A-A' in FIG. 14, in accordance with some embodiments.

Next, a dielectric material 135 is formed covering the transformed portions 127 and filling in the opening structure 134, as shown in FIGS. 14 and 15 in accordance with some embodiments. The respective step is illustrated as the step S23 in the method 10 shown in FIG. 1. In some embodiments, the dielectric material 135 includes silicon oxide, silicon nitride, silicon oxynitride, fluoride-doped silicate glass (FSG), low-k dielectric material or another suitable material. The dielectric material 135 may be formed by a deposition process, such as a CVD process, a PVD process, an ALD process, a spin-on coating process or another suitable process.

Figure 16:
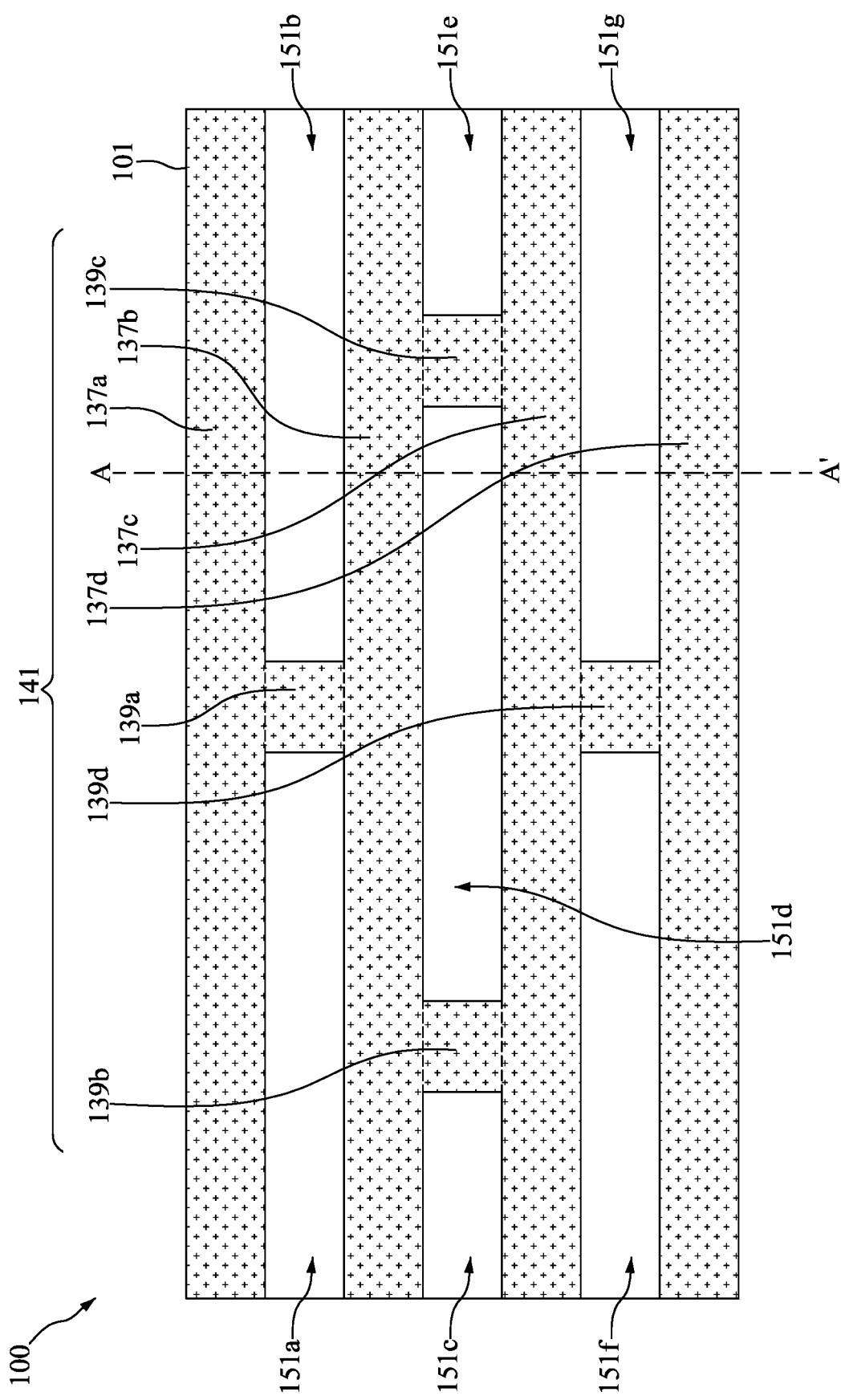
FIG. 16 is a top view illustrating an intermediate stage of planarizing the dielectric material to form an isolation structure in the opening structure during the formation of the semiconductor device structure, in accordance with some embodiments.
Figure 17:
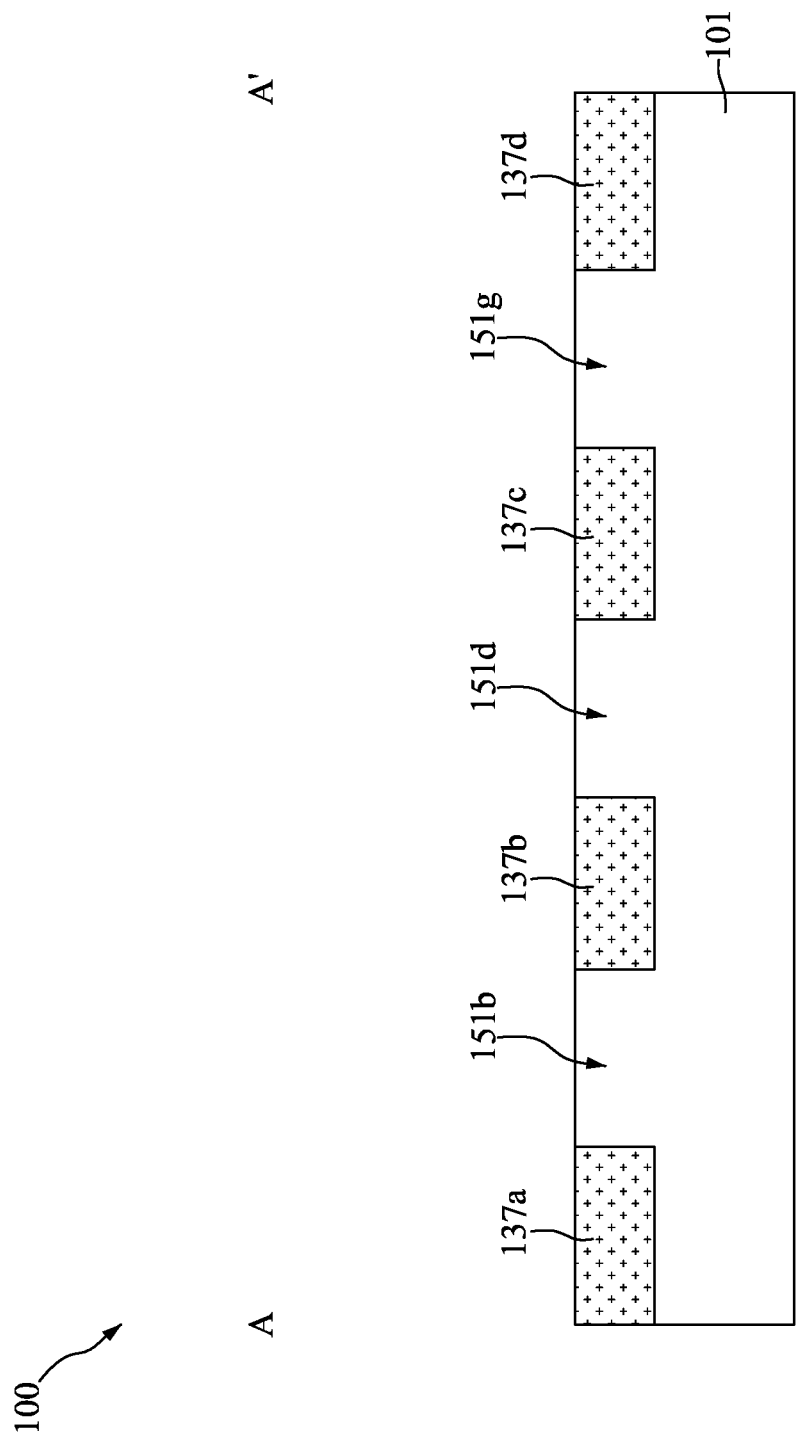
FIG. 17 is a cross-sectional view taken along line A-A' in FIG. 16, in accordance with some embodiments.

Subsequently, a planarization process is performed on the dielectric material 135 to expose the semiconductor substrate 101, such that an isolation structure 141 is formed in the opening structure 134 (see FIGS. 12 and 13), as shown in FIGS. 16 and 17 in accordance with some embodiments. The respective step is illustrated as the step S25 in the method 10 shown in FIG. 1. In some embodiments, the planarization process includes a chemical mechanical polishing (CMP) process.

In some embodiments, the isolation structure 141 includes a plurality of isolation portions 137*a*, 137*b*, 137*c*, 137*d*, 139*a*, 139*b*, 139*c* and 139*d*. In some embodiments, the isolation portions 137*a*, 137*b*, 137*c* and 137*d* are parallel to each other and are physically connected through the isolation portions 139*a*, 139*b*, 139*c* and 139*d*. In addition, the portions of the semiconductor substrate 101 covered by the transformed portions 127 in the previous step (see FIGS. 14 and 15) are exposed after the planarization process and become active areas 151*a*, 151*b*, 151*c*, 151*d*, 151*e*, 151*f* and 151*g*, in accordance with some embodiments.

In some embodiments, each of the active areas 151*a*, 151*b*, 151*c*, 151*d*, 151*e*, 151*f* and 151*g* has an island shape surrounded by the isolation structure 141. In some embodiments, the isolation structure 141 has several ring-shaped portions, and each of the active areas 151*a*, 151*b*, 151*c*, 151*d*, 151*e*, 151*f* and 151*g* is surrounded by a ring-shaped portion of the isolation structure 141. After the isolation structure 141 is formed, the semiconductor device structure 100 is obtained.

In some embodiments, the method for preparing the semiconductor device structure 100 includes forming a nitrogen-containing pattern 115 over the semiconductor substrate 101, and performing the energy-treating process 125 on the semiconductor substrate 101 to form the transformed portion 127 between the semiconductor substrate 101 and the nitrogen-containing pattern 115. The method for preparing the semiconductor device structure 100 also includes etching the semiconductor substrate 101 to form the opening structure 134 using the transformed portion 127 as an etching mask. In some embodiments, the isolation structure 141 is formed in the opening structure 134. Therefore, a lower contact resistance between the active areas 151*a*, 151*b*, 151*c*, 151*d*, 151*e*, 151*f* and 151*g* surrounded by the isolation structure 141 and subsequently formed overlying contacts can be obtained without increasing the size of the active areas 151*a*, 151*b*, 151*c*, 151*d*, 151*e*, 151*f* and 151*g*. As a result, the fabrication cost and time of the semiconductor device structure 100 can be reduced, and greater design flexibility can be achieved.

Figure 18:
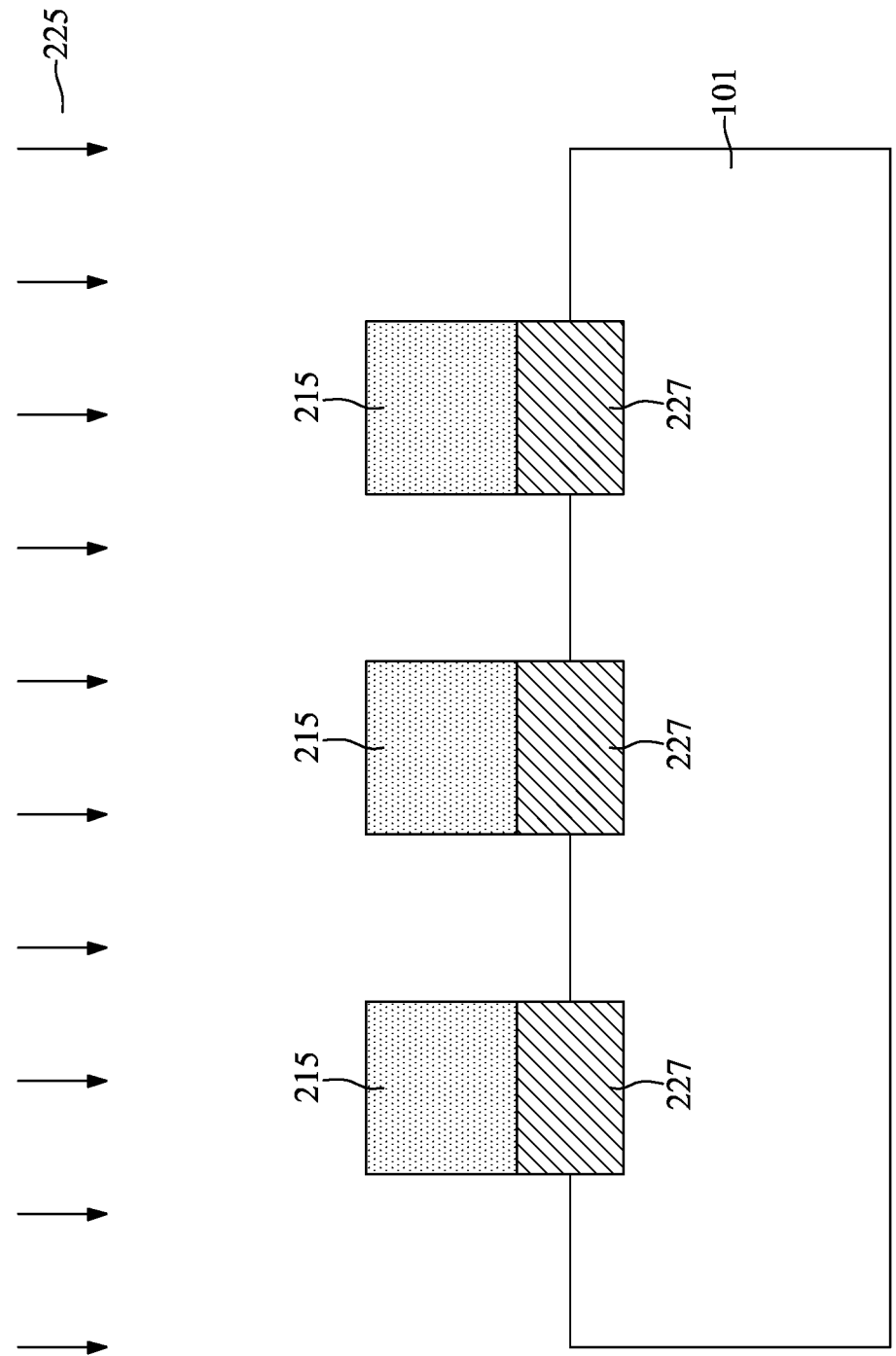
FIG. 18 is a cross-sectional view illustrating an intermediate stage of performing an energy treating process to form a plurality of transformed portions in the semiconductor substrate during the formation of the semiconductor device structure, in accordance with some embodiments.
Figure 19:
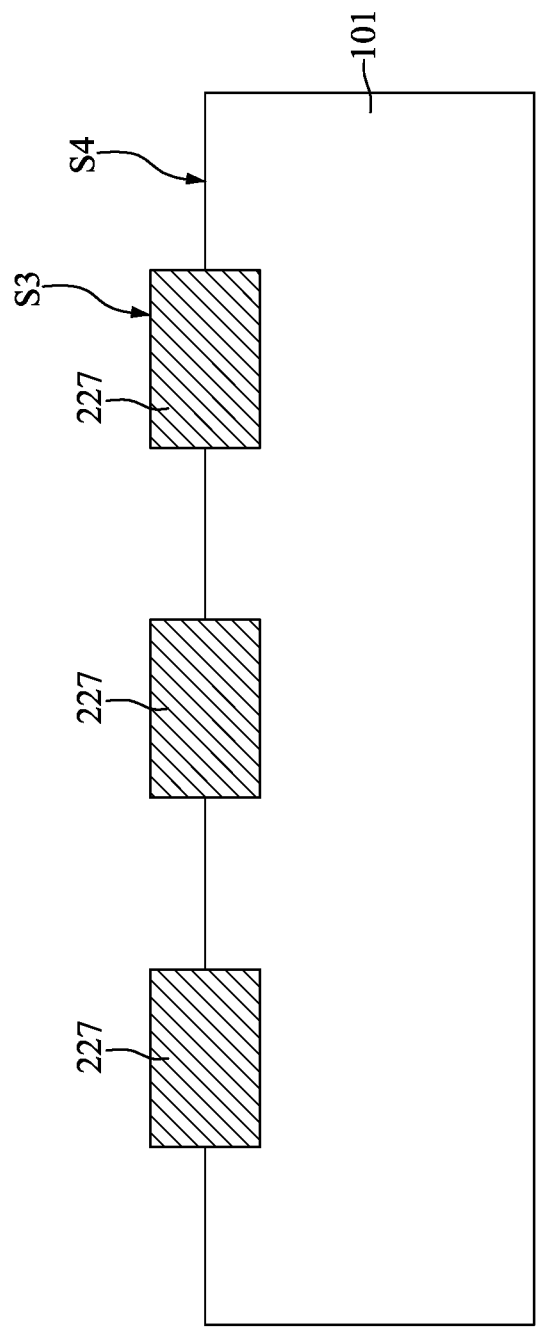
FIG. 19 is a cross-sectional view illustrating an intermediate stage of removing the nitrogen-containing patterns during the formation of the semiconductor device structure, in accordance with some embodiments.
Figure 20:
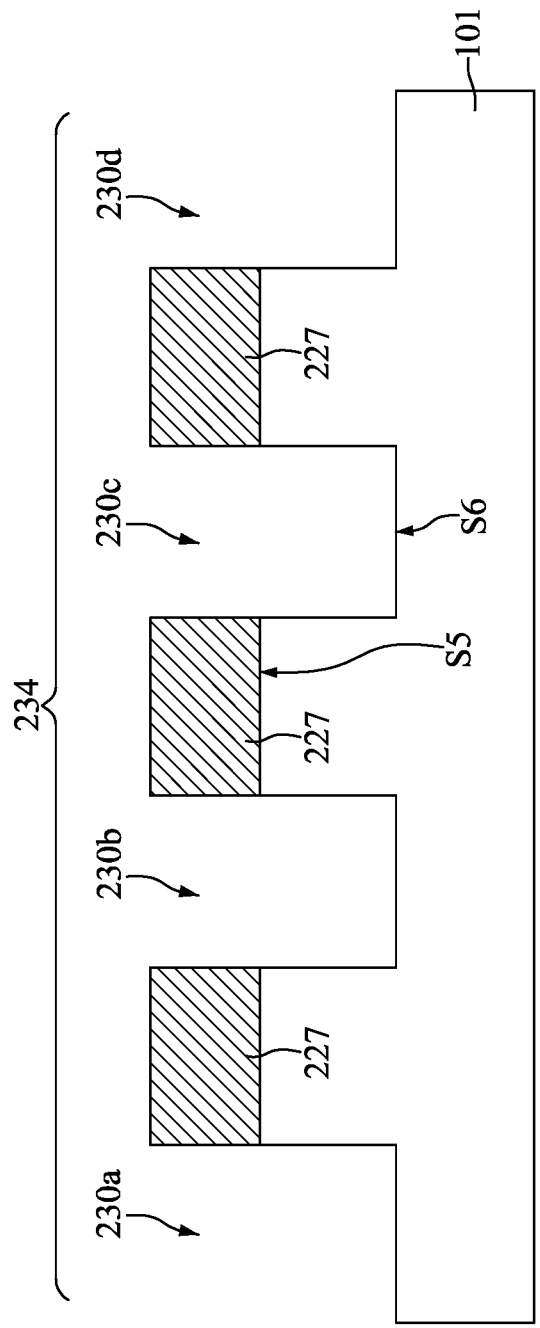
FIG. 20 is a cross-sectional view illustrating an intermediate stage of etching the semiconductor substrate to form an opening structure using the transformed portions as an etching mask during the formation of the semiconductor device structure, in accordance with some embodiments.

FIGS. 18-20 are cross-sectional views illustrating various stages of another method for forming the semiconductor device structure 100, in accordance with some modified embodiments. It should be pointed out that operations before the structure shown in FIG. 18 are substantially the same as the operations shown in FIGS. 2-8, and the related detailed descriptions may refer to the foregoing paragraphs and are not discussed again herein.

After the patterned mask 105 over the nitrogen-containing patterns 115 is removed, an energy treating process 225 is performed to form a plurality of transformed portions 227 from the interfaces between the semiconductor substrate 101 and the nitrogen-containing patterns 115, as shown in FIG. 18 in accordance with some embodiments. After the energy treating process 225 is performed, the transformed portions 227 are covered by and in direct contact with the remaining portions of the nitrogen-containing patterns 215.

In some embodiments, the energy treating process 225 includes a nitridation process. Similar to the transformed portions 127 shown in FIGS. 8 and 9, each of the transformed portions 227 has an island shape, and the transformed portions 227 are parallel to each other, in accordance with some embodiments.

After the energy treating process 225 is performed, the nitrogen-containing patterns 215 are removed, as shown in FIG. 19 in accordance with some embodiments. In some embodiments, the nitrogen-containing patterns 215 are removed to expose the transformed portions 227. In some embodiments, the nitrogen-containing patterns 215 are removed by a stripping process, an ashing process, an etching process, or another suitable process. Moreover, the top surfaces S3 of the transformed portions 227 are higher than the top surface S4 of the semiconductor substrate 101, in accordance with some embodiments.

Next, an etching process is performed on the semiconductor substrate 101 to form an opening structure 234 using the transformed portions 227 as an etching mask, as shown in FIG. 20 in accordance with some embodiments. The etching process may be a wet etching process, a dry etching process, or a combination thereof. In some embodiments, the opening structure 234 includes a plurality of openings 230a, 230b, 230c and 230d.

Some details of the opening structure 234 are similar to, or the same as that of the opening structure 134 (see FIGS. 12 and 13) and are not repeated herein. For example, in a top view, the openings 230a, 230b, 230c and 230d are parallel to each other and are physically connected through a plurality of openings (not shown). Moreover, the interfaces S5 between the transformed portions 227 and the semiconductor substrate 101 are higher than the bottom surfaces S6 of the opening structure 234, in accordance with some embodiments.

Subsequently, a dielectric material (not shown) is formed covering the transformed portions 227 and filling in the opening structure 234, and a planarization process is performed on the dielectric material to expose the semiconductor substrate 101, such that an isolation structure (not shown) is formed in the opening structure 234, in accordance with some embodiments. In some embodiments, the dielectric material includes silicon oxide, silicon nitride, silicon oxynitride, FSG, low-k dielectric material or another suitable material, and the dielectric material may be formed by a deposition process, such as a CVD process, a PVD process, an ALD process, a spin-on coating process or another suitable process. In addition, the planarization process includes a CMP process.

Although the steps of forming the dielectric material and planarizing the dielectric material to form the isolation structure are not shown, it should be noted that these steps are similar to the steps shown in FIGS. 14-17, and are not repeated herein. In some embodiments, each of the active areas in the semiconductor substrate 101 has an island shape surrounded by the isolation structure. In some embodiments, the isolation structure has several ring-shaped portions, and each of the active areas is surrounded by a ring-shaped portion of the isolation structure. After the isolation structure is formed, the semiconductor device structure is obtained.

Embodiments of a method for preparing a semiconductor device structure (e.g., the semiconductor device structure 100) are provided in the disclosure. The method includes performing an energy-treating process (e.g., the energy-treating process 125 or 225) on a semiconductor substrate (e.g., the semiconductor substrate 101) to form a transformed portion (e.g., the transformed portion 127 or 227) covered by a nitrogen-containing pattern (e.g., the nitrogen-containing pattern 115 or 215). The method also includes etching the semiconductor substrate to form an opening structure (e.g. the opening structure 134 or 234) using the transformed portion as an etching mask. In some embodiments, an isolation structure (e.g., the isolation structure 141) is formed in the opening structure. Therefore, a lower contact resistance between an active area (e.g., the active areas 151a-g) surrounded by the isolation structure and an overlying contact can be obtained without increasing the size of the active area. As a result, the fabrication cost and time of the semiconductor device structure can be reduced, and greater design flexibility can be achieved.

In one embodiment of the present disclosure, a method for preparing a semiconductor device structure is provided. The method includes forming a nitrogen-containing pattern over a semiconductor substrate. The method also includes performing an energy treating process to form a transformed portion in the semiconductor substrate and covered by the nitrogen-containing pattern. The method further includes etching the semiconductor substrate such that the transformed portion is surrounded by an opening structure.

In another embodiment of the present disclosure, a method for preparing a semiconductor device structure is provided. The method includes forming a nitrogen-containing pattern over a semiconductor substrate. The method also includes performing an energy treating process to transform a portion of the semiconductor substrate into a transformed portion. The method further includes removing the nitrogen-containing pattern to expose the transformed portion. In addition, the method includes performing an etching process on the semiconductor substrate using the transformed portion as an etching mask.

In yet another embodiment of the present disclosure, a method for preparing a semiconductor device is provided. The method includes forming a plurality of nitrogen-containing patterns over a semiconductor substrate. The method also includes performing an energy treating process to transform portions of the semiconductor substrate into a plurality of transformed portions. The method further includes removing the nitrogen-containing patterns after the energy treating process is performed. In addition, the method includes performing an etching process on the semiconductor substrate using the transformed portions as an etching mask, such that each of the transformed portions is surrounded by an opening structure.

The embodiments of the present disclosure have some advantageous features. By forming the transformed portion, and etching the semiconductor substrate using the transformed portion as an etching mask, a lower contact resistance can be obtained without increasing the size of the active area. As a result, the fabrication cost and time of the semiconductor device structure can be reduced, and greater design flexibility can be achieved.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, and steps.

What is claimed is:

1. A method for preparing a semiconductor device structure, comprising:
   forming a nitrogen-containing pattern over a semiconductor substrate;
   performing an energy treating process to form a transformed portion in the semiconductor substrate and covered by the nitrogen-containing pattern, wherein a portion of the semiconductor substrate covered by the nitrogen-containing pattern is transformed into the transformed portion while another portion of the semiconductor substrate exposed by the nitrogen-containing pattern remains intact during the energy treating process;

etching the semiconductor substrate such that the transformed portion is surrounded by an opening structure; and removing the nitrogen-containing pattern after the energy treating process is performed, wherein the nitrogen-containing pattern is removed before the semiconductor substrate is etched.

2. The method for preparing a semiconductor device structure of claim 1, wherein the semiconductor substrate is etched using transformed portion as an etching mask.

3. The method for preparing a semiconductor device structure of claim 1, further comprising:

forming an isolation structure in the opening structure, wherein an active area in the semiconductor substrate is surrounded by the isolation structure.

4. The method for preparing a semiconductor device structure of claim 3, wherein the forming the isolation structure includes:

forming a dielectric material covering the transformed portion and the semiconductor substrate, wherein the opening structure is filled by the dielectric material.

5. The method for preparing a semiconductor device structure of claim 4, wherein the forming the isolation structure further includes:

performing a planarization process on the dielectric material to remove the transformed portion and a portion of the dielectric material.

6. A method for preparing a semiconductor device structure, comprising:

forming a nitrogen-containing pattern over a semiconductor substrate;

performing an energy treating process to transform a portion of the semiconductor substrate into a transformed portion, wherein the portion of the semiconductor substrate covered by the nitrogen-containing pattern is transformed into the transformed portion while another portion of the semiconductor substrate exposed by the nitrogen-containing pattern remains intact during the energy treating process;

removing the nitrogen-containing pattern to expose the transformed portion; and performing an etching process on the semiconductor substrate using the transformed portion as an etching mask.

7. The method for preparing a semiconductor device structure of claim 6, wherein the transformed portion is covered by and in direct contact with the nitrogen-containing pattern before the nitrogen-containing pattern is removed.

8. The method for preparing a semiconductor device structure of claim 6, wherein the etching process is performed after the nitrogen-containing pattern is removed.

9. The method for preparing a semiconductor device structure of claim 6, wherein a portion of the semiconductor substrate exposed by the transformed portion is removed to form an opening structure during the etching process, and an interface between the transformed portion and the semiconductor substrate is higher than a bottom surface of the opening structure.

10. The method for preparing a semiconductor device structure of claim 9, wherein the opening structure has a ring shape, and the transformed portion has an island shape surrounded by the opening structure.

11. The method for preparing a semiconductor device structure of claim 9, further comprising:

filling the opening structure with an isolation structure; and removing the transformed portion such that an active area surrounded by the isolation structure is exposed.

12. A method for preparing a semiconductor device structure, comprising:

forming a plurality of nitrogen-containing patterns over a semiconductor substrate;

performing an energy treating process to transform portions of the semiconductor substrate into a plurality of transformed portions, wherein portions of the semiconductor substrate covered by the nitrogen-containing patterns are transformed into the transformed portions while other portions of the semiconductor substrate exposed by the nitrogen-containing patterns remain intact during the energy treating process;

removing the nitrogen-containing patterns after the energy treating process is performed; and performing an etching process on the semiconductor substrate using the transformed portions as an etching mask, such that each of the transformed portions is surrounded by an opening structure.

13. The method for preparing a semiconductor device structure of claim 12, wherein the forming the nitrogen-containing patterns includes:

forming a nitrogen-containing layer over the semiconductor substrate;

forming a patterned mask over the nitrogen-containing layer; and etching the nitrogen-containing layer using the patterned mask as an etching mask.

14. The method for preparing a semiconductor device structure of claim 13, wherein the nitrogen-containing patterns are parallel to and separated from each other.

15. The method for preparing a semiconductor device structure of claim 12, further comprising:

forming an isolation structure in the opening structure; and removing the transformed portions to expose a plurality of active areas in the semiconductor substrate.

16. The method for preparing a semiconductor device structure of claim 15, wherein each of the active areas has an island shape surrounded by the isolation structure.

17. The method for preparing a semiconductor device structure of claim 12, wherein the energy treating process includes a nitridation process.

18. The method for preparing a semiconductor device structure of claim 12, wherein a top surface of the transformed portions is higher than a top surface of the semiconductor substrate before the etching process is performed.

* * * * *